United States Patent [19]

Yamamoto

[11] Patent Number: 4,500,504
[45] Date of Patent: Feb. 19, 1985

[54] PROCESS FOR PREPARING SILICON CARBIDE WHISKERS

[75] Inventor: Akira Yamamoto, Nagoya, Japan

[73] Assignee: Tokai Carbon Co., Ltd., Tokyo, Japan

[21] Appl. No.: 460,796

[22] Filed: Jan. 25, 1983

[30] Foreign Application Priority Data

Feb. 25, 1982 [JP] Japan .................................. 57-28146

[51] Int. Cl.$^3$ .......................................... C01B 31/36
[52] U.S. Cl. ..................................... 423/345; 501/88; 501/95; 156/DIG. 112
[58] Field of Search .................... 423/345; 501/88, 95; 156/DIG. 68, DIG. 112

[56] References Cited

U.S. PATENT DOCUMENTS

| | | | |
|---|---|---|---|
| 3,840,647 | 10/1974 | Tomita et al. | 423/345 |
| 3,948,806 | 4/1976 | Witt | 423/338 |
| 4,148,864 | 4/1979 | Groth et al. | 423/338 |
| 4,230,679 | 10/1983 | Mahler et al. | 423/338 |
| 4,283,375 | 8/1981 | Horne et al. | 423/345 |

FOREIGN PATENT DOCUMENTS

| | | | |
|---|---|---|---|
| 1264720 | 2/1972 | United Kingdom | 423/345 |
| 0729125 | 4/1980 | U.S.S.R. | 423/345 |

*Primary Examiner*—John Doll
*Assistant Examiner*—Steven Capella
*Attorney, Agent, or Firm*—Birch, Stewart, Kolasch & Birch

[57] ABSTRACT

The process according to the present invention involves mixing 100 parts by weight of a silica gel, containing 6.0 to 25.0% by weight with respect to a silicon of a water-soluble compound of at least one metal selected from the group consisting of iron, nickel and cobalt, with 110 to 400 parts by weight of furnace carbon black having a structure indicated by a DBP absorption number of 50 ml/100 g or higher, and then reacting the mixture under a non-oxidative atmosphere at a temperature of 1,300° to 1,700° C. to produce silicon carbide whiskers.

10 Claims, 2 Drawing Figures

PROCESS FOR PREPARING SILICON CARBIDE WHISKERS

BACKGROUND OF THE INVENTION

The present invention relates to a process for preparing silicon carbide whiskers and, more particularly, to a process for preparing silicon carbide whiskers of a high quality with a high yield.

Since each whisker, constituting a single crystal of silicon carbide, exhibits excellent properties such as specific strength, specific elastic modulus, heat resistance, chemical stability and so on, the whiskers has a potential for use as a composite reinforcing material for metals, plastics and ceramics. The production of silicon carbide may be largely controlled by various factors such as the raw materials used, i.e., siliceous and carbonaceous materials, a ratio of composition, and an atmosphere and temperature of the reaction. The combination of these factors is significant in the production of silicon carbide whiskers of high quality with a high yield.

Heretofore, various techniques of preparing silicon carbide have been known: a process in which a silicon halide such as silicon tetrachloride is reacted with a carbonaceous source such as carbon tetrachloride, benzene or methane in hydrogen streams at high temperatures; a process utilizing a vapor raw material system in which, for example, a silane compound such as trichlorosilane ($CH_3SiCl_3$) is pyrolyzed in hydrogen streams; and a process utilizing a solid raw material system in which, for example, a siliceous material such as silica sand or metal silicon is reacted with a carbonaceous material such as coke or graphite powder.

SUMMARY OF THE INVENTION

The present invention has been developed and completed from the following findings obtained as a result of extensive studies of conditions required for preparing silicon carbide whiskers of high quality with a high yield. The findings are: in the solid raw material system, the use of raw materials of porous structure may effectively act to improve the properties and the yield of the resulting silicon carbide whiskers, and the crystal growth of the silicon carbide whiskers may be promoted in instances where a catalyst component is present with a siliceous material, since the whiskers grows primarily from the interface of the siliceous material.

The process in accordance with the present invention is characterized in that 100 parts by weight of a silica gel are mixed with 110 to 400 parts by weight of a furnace carbon black, and the two mixed raw materials are reacted together in a non-oxidizing atmosphere and at a temperature ranging from 1,300° to 1,700° C., said silica gel being of a type which contains a water-soluble compound of at least one metal selected from the group consisting of iron, nickel and cobalt in an amount of 6.0 to 25.0% by weight with respect to the silicon, and said furnace carbon black being of the type that it has a structure indicated by a DBP (dibutyl phthalate) absorption number of 50 ml/100 g or more. Thus, the process according to the invention which satisfies these conditions can provide a silicon carbide whiskers of superior quality with a high yield.

DETAILED DESCRIPTION OF THE PREFERRED EMBODIMENTS

Figure 1:
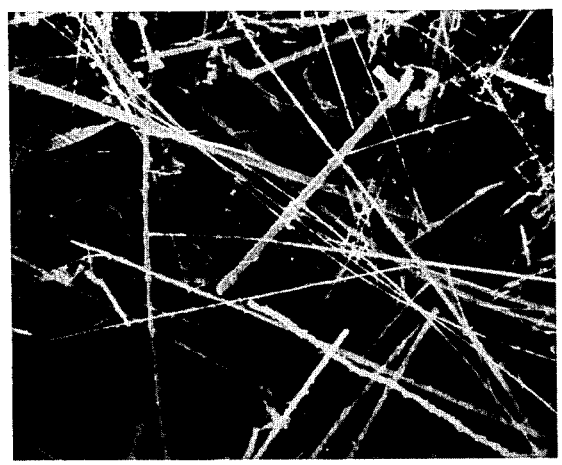
FIG. 1 is an electron micrograph (magnification: 1,700) illustrating the structure of silicon carbide whiskers produced in Example 8 which follows.

The silica gel to be used as the silicon source material in accordance with the present invention is composed of silicic acid containing an $SiO_2$ component of about 99.5% and has a fine porous structure having a surface area of 450 m$^2$/g or more. For the silica gel it is preferred to use a synthetic silica gel obtainable by decomposing sodium silicate with an inorganic acid such as hydrochloric acid or sulfuric acid and then subjecting the resulting coagulated product to washing with water and drying. Such a synthetic silica gel may be appropriately used because of its homogeneous composition and high purity.

In accordance with the present invention, the silica gel may be used in powder form; however, it has to be treated before use so as to contain, as a catalyst component, a water-soluble compound of at least one metal selected from the group consisting of iron, nickel and cobalt. The catalyst component is contained in an amount ranging from 6.0 to 25.0% by weight based on the silicon. In instances where the amount of the catalyst component is less than 6.0% by weight, it may not effectively improve promotion of the crystal growth of the silicon carbide whiskers, and it may increase the proportion of residual product which remains as silicon carbide granules. In instances where the amount of the catalyst component exceeds 25.0% by weight, whisker length becomes irregular and irregularity in the whisker aspect ratio may also be caused. As a procedure by which the catalyst component is homogeneously introduced into the silica gel, the most effective technique involves pulverizing the synthetic silica gel into fine particles having particle sizes of 150 mesh or less, and preferably of 200 mesh or less; immersing the fine particles in a water-soluble compound such as a chloride or nitrate of iron, nickel and/or cobalt in an aqueous form, so as to allow such a solution to penetrate therein; and then drying them.

As the carbonaceous source, the furnace carbon black having a DBP (dibutyl phthalate) absorption number of 50 ml/100 g or higher as a structural characteristic, which is made by a thermal cracking of heavy hydrocarbon oil of the petroleum or coal type may be selectively employed.

Furnace carbon black has surface characteristics and a particle structure different from the more usual carbonaceous materials such as coke powder and graphite powder, such that furnace carbon black inherently has the necessary properties. Among various kinds of furnace carbon black, those having a structure indicated by a DBP absorption number of 50 ml/100 g or higher have a porous structure particularly appropriate for the production of silicon carbide whiskers. The characteristics of the furnace carbon black to be used as one of the raw materials allow it to mix with the finely porous structure of the silica gel to be used as the siliceous source material so as to greatly contribute to improvement in the characteristics and the yield of whiskers.

The use of furnace carbon black having a DBP absorption number of less than 50 ml/100 g is inappropriate in terms of the desired properties of the resulting SiC whiskers and the yield thereof.

In accordance with the present invention, furnace carbon black as the carbonaceous source is mixed in an amount of 110 to 400 parts by weight with 100 parts by weight of silica gel as the siliceous source material. Although the amount of the carbon black exceeds the amount necessary for the reaction itself, a smaller amount of carbonaceous source may cause the production of a larger amount of silicon carbide crystals of fine granular form, leading to a substantial decrease in the yield of silicon carbide whiskers. However, in instances where the amount of the carbonaceous source exceeds the upper limit, it does not serve to increase the yield of silicon carbide whiskers, and it complicates the post-treatment of the reaction products due to the irregular occurrence of the whisker product and to an increase in residual carbonaceous source.

The silica gel containing the catalyst component is homogeneously admixed with the furnace carbon black. The presence of sodium chloride as a material for forming a production space within the raw material system serves to prompt the raw materials to form spaces conductive to whisker growth (due to its boiling action) and acts as a flux to accelerate the volatilization of the siliceous source material. As a result, the use of sodium chloride can improve the production yield and the elongation of whisker crystals even further. In accordance with the present invention, sodium chloride may be mixed with the raw materials in an amount ranging from 80 to 200% by weight with respect to the silica gel, or such an amount may be placed so as to be situated directly beneath the raw materials. In instances where the amount of sodium chloride is less than 80% by weight, it becomes ineffective in improving production yield and may cause inappropriate crystal elongation of silicon carbide whiskers. In instances where the amount of sodium chloride exceeds 200% by weight, no effect in increasing yield can be detected, and handling procedures during the reaction become difficult.

The raw materials may be heated and reacted after being charged into a reactor composed of a heat-resistant material such as graphite. The heating of the reactor may be conducted, for example, by closing the reactor inlet with the lid, covering the reactor with a carbon packing material such as coke powder, and subjecting it to heating by passing an electric current therethough. The heating may be carried out under a non-oxidizing atmosphere at a temperature ranging from 1,300° to 1,700° C., and preferably from 1,500° to 1,650° C., for at least 2 hours. Heating at temperatures below 1,300° C. renders the formation of SiC whiskers difficult, and heating at temperatures above 1,700° C. decreases the aspect ratio of the SiC whiskers produced, leading to the production of individual SiC whiskers which are thick and short in size and have brittle characteristics.

During the heating step of the process in accordance with the present invention, the siliceous component and the carbonaceous component in the raw materials may be converted into silicon carbide single crystals of fine fiber form, due to the reaction taking place at high temperatures. In the course of this step, the whisker growth may proceed extremely smoothly and rapidly by acceleration of the growth rate of silicon carbide whiskers due to the peculiar fine porous structure of the silica gel as the siliceous source material and the furnace carbon black as the carbonaceous source in combination with the catalyst component present in the silica gel. Furthermore, the use of a larger amount of furnace carbon black than is necessary for the reaction, and the presence of the catalyst component contained in the silica gel in a particular amount provides the additional effects of suppressing the production of granular silicon carbide and of producing silicon carbide whiskers with uniform properties. In accordance with the present invention, all these factors are combined effectively so as to produce silicon carbide whiskers of high quality with a high yield.

The carbonaceous source remaining unreacted in the product mixture may be removed by burning. The burning procedure is carried out by heating the product mixture in air at a temperature of at least 550° C.

It is found, in accordance with the present invention, that the product obtained after the burning step substantially consists of silicon carbide whiskers of a pale green-white color, except for a very small amount of silicon carbide in fine granular form. The yield of silicon carbide whiskers with respect to the silica gel as the raw material accomplished by the present invention approximates the theoretical yield. The whisker produced according to the present invention is a $\beta$-form single crystal having a favorable aspect ratio as indicated by a diameter ranging from 0.2 to 0.5 $\mu$m and a length ranging from 200 to 300 $\mu$m.

The present invention will now be described in more detail by way of working examples.

Examples 1–11 and Comparative Examples 1–11

Sodium silicate (water glass) was decomposed with hydrochloric acid and the resulting coagulated material was washed with water and then dried to give a silica gel containing 99.5% of $SiO_2$, which in turn was pulverized into particles having a particle size of 200 mesh or less. The fine particles were immersed in an aqueous solution of ferrous chloride ($FeCl_2.4H_2O$), nickel nitrate [$Ni(NO_3)_2.6H_2O$] or cobalt chloride ($CoCl_2.6H_2O$) in varying concentrations. After such an aqueous solution had penetrated into the fine particles to a satisfactory degree, they were treated by heating and drying so as to contain various amounts of a catalyst component.

The resulting catalyst component-carrying silica gel as a siliceous source material was homogeneously mixed in an amount of 100 parts by weight with 110 parts by weight of an IISAF-high structure (Hs) grade furnace carbon black ("SEAST 5H": Tokai Carbon Co., Ltd.) as a carbonaceous source. The carbon black had a DBP absorption number of 130 ml/100 g and an iodine absorption number of 104 mg/g.

The mixture, in the amount of 50.0 g, was loosely packed into a reactor, made of a high purity graphite, and having an inner diameter of 70 mm and a height of 150 mm, and the reactor was closed with a lid made of graphite and then transferred to an electric furnace of the Acheson type. Thereafter, the reactor was covered with a packing material of coke granules. The furnace was then heated to 1,600° C. and the reaction was carried out at this temperature for 4 hours while maintaining a non-oxidizing atmosphere inside the furnace.

After the heating treatment, the reaction product was collected from the reactor and then heated again at 700° C. in air to burn off any remaining unreacted carbonaceous source. The product samples obtained in Examples 1–11 were found to be silicon carbide whiskers in a seaweed-like form having a pale green-white color. The X-ray diffraction of each product sample showed that peak characteristics of β-SiC atomic distances were indicated at the angles corresponding to the distance of 2.51 Å and 1.54 Å, while no diffraction peaks whatsoever corresponding to $SiO_2$ and C were recognized. As a result, it was confirmed that the product samples were composed mainly of silicon carbide single crystals of the β-form. It was also shown that various amounts of the catalyst component in the silica gel resulted in differences in yield, amount of granular silicon carbide contamination of the whisker, aspect ratio, size, homogeneity and so on.

The results are shown in Table 1, in which the type and amount of catalyst component used are also indicated. For comparative purposes, 100 parts by weight of pure silicon dioxide powder as a siliceous source material was mixed with 110 parts by weight of graphite powder as a carbonaceous source, and the resulting mixture was further mixed with ferrous chloride or cobalt chloride in an amount of 7.0% by weight based on the siliceous source material, followed by treating under the same conditions as in the Examples indicated above. These results are also shown in Table 1.

The above results reveal that the examples in accordance with the present invention, in which the catalyst component is contained in the silica gel in a proportion of 6.0 to 25.0% by weight based on the silicon (Examples 1–11), are superior in yield, size and quality to comparative examples in which the amount of the catalyst component is outside the determined range (Comparative Examples 1–10), and in which the raw material system is different from that of Examples 1–11 (Comparative Example 11). It is further shown that the working examples in accordance with the present invention demonstrate a remarkable reduction in granular silicon carbide contamination compared to the examples where the amount of the catalyst component is below 6.0% by weight, and compared to Comparative Example 11. These results show the appropriateness of the resulting silicon carbide whiskers as a composite reinforcing material.

Figure 2:
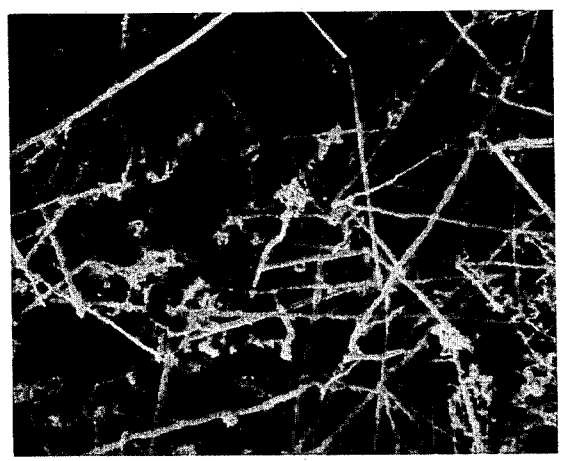
FIG. 2 is an electron micrograph (magnification: 1,700) illustrating the structure of silicon carbide whiskers produced in Comparative Example 8 which follows.

FIG. 1 shows a micrograph (magnification: 1,700) of silicon carbide whiskers of Example 8 taken with a scanning electron microscope. FIG. 2 shows an electron micrograph (magnification: 1,700) taken of silicon carbide whiskers of Comparative Example 8 in the same manner as FIG. 1. A comparative study of FIGS. 1 and 2 reveals that the silicon carbide whiskers obtained in

TABLE 1

| | Catalyst | | Yield (% by wt. per Si source) | Degree of granular SiC contamination (microscopic observation)* | Properties | | |
|---|---|---|---|---|---|---|---|
| | Type | Content (% by wt. per Si) | | | Diameter (μm) | Length (μm) | Homogeneity** |
| Comparative Example 1 | | 2.0 | 94 | +++ | 0.1~0.5 | 100~200 | Good |
| Comparative Example 2 | | 4.0 | 95 | ++ | 0.1~0.5 | 100~200 | Good |
| Example 1 | | 6.0 | 98 | ± | 0.3~0.5 | 200~300 | Good |
| Example 2 | $FeCl_2 \cdot 4H_2O$ | 10.0 | 99 | − | 0.3~0.5 | 200~300 | Good |
| Example 3 | | 20.0 | 99 | − | 0.3~0.5 | 200~300 | Good |
| Example 4 | | 25.0 | 98 | − | 0.3~0.5 | 200~300 | Good |
| Comparative Example 3 | | 30.0 | 98 | − | 0.3~0.5 | 200~500 | Poor |
| Comparative Example 4 | | 3.0 | 94 | +++ | 0.1~0.5 | 100~200 | Good |
| Comparative Example 5 | | 5.0 | 96 | +++ | 0.1~0.5 | 100~200 | Good |
| Example 5 | $Ni(NO_3)_2 \cdot 6H_2O$ | 7.0 | 99 | ± | 0.3~0.5 | 200~300 | Good |
| Example 6 | | 12.0 | 99 | − | 0.3~0.5 | 200~300 | Good |
| Example 7 | | 23.0 | 98 | − | 0.3~0.5 | 200~300 | Good |
| Comparative Example 6 | | 26.0 | 98 | ± | 0.3~0.5 | 200~500 | Poor |
| Comparative Example 7 | | 28.0 | 98 | − | 0.3~0.5 | 200~500 | Poor |
| Comparative Example 8 | | 2.0 | 93 | +++ | 0.1~0.5 | 100~200 | Good |
| Comparative Example 9 | | 5.0 | 96 | + | 0.1~0.5 | 100~200 | Good |
| Example 8 | $CoCl_2 \cdot 6H_2O$ | 6.0 | 99 | − | 0.3~0.5 | 200~300 | Good |
| Example 9 | | 10.0 | 99 | − | 0.3~0.5 | 200~300 | Good |
| Example 10 | | 20.0 | 99 | − | 0.3~0.5 | 200~300 | Good |
| Example 11 | | 25.0 | 99 | − | 0.3~0.5 | 200~300 | Good |
| Comparative Example 10 | | 26.0 | 99 | − | 0.3~0.5 | 50~600 | Poor |
| Comparative Example 11 | $FeCl_2$ | 7.0 | 92 | +++ | 0.1~0.5 | 50~150 | Poor |
| Comparative Example 11 | $CoCl_2$ | 7.0 | 94 | ++ | 0.1~0.5 | 50~150 | Poor |

Notes:
*+++: estimated content, higher than 40%
++: estimated content, 20–40%
+: estimated content, 10–20%
±: estimated content, 5–10%
−: estimated content, lower than 5%
**Good: Uniform in diameter and length and homogeneous in aspect ratio
Poor: Irregular in diameter and length and heterogeneous in aspect ratio Example 8 is contaminated with a significantly smaller amount of granular silicon carbide than that obtained in Comparative Example 8.

Examples 12–13 and Comparative Example 12

Fine powder of a silica gel prepared in the same manner as in Examples 1 to 11 so as to contain 10.0% by weight of cobalt chloride ($CoCl_2.6H_2O$) with respect to the silicon was homogeneously mixed in an amount of 100 parts by weight with 110 parts by weight of each of three different kinds of carbon black as carbonaceous source ("SEAST N": Tokai Carbon Co., Ltd; "Color Black #50": Mitsubishi Kasei Kogyo K.K.; and "Thermal FT": Asahi Carbon K.K., respectively) having various DBP absorption numbers and iodine absorption numbers as shown in Table 2 below. The mixture was then reacted by heating at 1,600° C. for 4 hours in the same manner and using the same apparatus as in Examples 1 to 11. The resulting reaction product was further thermally treated in the same manner as in Examples 1 to 11 to burn off the remaining unreacted carbonaceous source.

It was found that the silicon carbide whiskers obtained above in accordance with the present invention was of a single crystal structure composed mainly of silicon carbide of the β-form as in the case of the whiskers produced in Examples 1 to 11. The products were then measured for yield, degree of contamination by granular silicon carbide and properties, in the same manner as in Examples 1 to 11. The results are shown in Table 2.

Comparative Example 12 in which the DBP absorption number was less than 50 ml/100 g. As illustrated by the product obtained in Comparative Example 12, only short SiC whiskers having a low homogeneity and contaminated with a large amount of granular SiC were obtained in instances where the carbon black used was not furnace carbon black and had a DBP absorption number of less than 50 ml/100 g.

Examples 14–15 and Comparative Example 3

100 parts by weight of a fine powder of a silica gel prepared in the same manner as in Examples 1 to 11 so as to contain 10.0% by weight of cobalt chloride ($CoCl_2.6H_2O$) based on the silicon were homogeneously mixed with an IISAF-Hs (high structure) grade furnace carbon black ("SEAST 5H": Tokai Carbon Co., Ltd.) as carbonaceous source having a DBP absorption number of 130 ml/100 g and an iodine absorption number of 104 mg/g in the amount as illustrated in Table 3 below. The mixture was then reacted by heating at 1,600° C. for 4 hours in the same manner and using the same apparatus as in Examples 1 to 11. The reaction product was further thermally treated in the same manner as in Examples 1 to 11 in order to burn off the remaining unreacted carbonaceous source.

The whisker obtained in Examples 14 and 15 was found to be composed mainly of silicon carbide single crystals of the β-form as in the case of the products obtained in Examples 1 to 11. The products were then measured for their yield, degree of granular SiC contamination and properties. The results are shown in Table 3 below.

TABLE 2

| | Carbon black | | | Catalyst | | Yield (% by wt. per Si source material) | Degree of granular SiC comtamination (microscopic observation)* | Properties | | |
|---|---|---|---|---|---|---|---|---|---|---|
| | Trade name | DBP absorption number (ml/100 g) | Iodine absorption number (mg/g) | Amount (parts by wt.) | Type | Content (% by wt. per Si) | | | Diameter (μm) | Length (μm) | Homogeneity** |
| Example 12 | SEAST N | 97 | 70 | 110 | $CoCl_2.6H_2O$ | 10.0 | 98 | — | 0.3~0.5 | 200~300 | Good |
| Example 13 | Color Black #50 | 64 | 83 | 110 | $CoCl_2.6H_2O$ | 10.0 | 97 | ± | 0.2~0.5 | 200~300 | Good |
| Comparative Example 12 | Thermal FT | 27 | 26 | 110 | $CoCl_2.6H_2O$ | 10.0 | 95 | +++ | 0.3~0.5 | 10~50 | Poor |

Note
The degree of granular SiC contamination * and the homogeneity rating ** are referred to in notes accompanying Table 1.

As is apparent from the results of Table 2, the working examples according to the present invention in which furnace carbon black having a DBP absorption number of 50 ml/100 g or more was used (Examples 12 and 13) provided a better yield, a lower degree of granular SiC contamination, and better properties than did

TABLE 3

| | Carbon black | | | Catalyst | | Yield (% by wt. per Si source material) | Degree of granular SiC comtamination (microscopic observation)* | Properties | | |
|---|---|---|---|---|---|---|---|---|---|---|
| | Trade name | DBP absorption number (ml/100 g) | Iodine absorption number (mg/g) | Amount (parts by wt.) | Type | Content (% by wt. per Si) | | | Diameter (μm) | Length (μm) | Homogeneity** |
| Example 14 | SEAST 5H | 130 | 104 | 300 | $CoCl_2.6H_2O$ | 10.0 | 99 | — | 0.2~0.5 | 200~500 | Good |
| Example 15 | SEAST 5H | 130 | 104 | 400 | $CoCl_2.6H_2O$ | 10.0 | 99 | — | 0.2~0.5 | 200~600 | Good |
| Comparative Example 13 | SEAST 5H | 130 | 104 | 500 | $CoCl_2.6H_2O$ | 10.0 | 99 | — | 0.2~0.5 | 100~600 | Good |

Note
The degree of granular SiC contamination * and the homogeneity rating ** are referred to in notes accompanying Table 1.

As shown in Table 3, the examples according to the present invention in which carbon black was used within a defined range of 110 to 400 parts by weight (Examples 14 and 15) provided yields and properties substantially equal to Comparative Example 13 in which the amount of carbon black exceeded the defined upper limit. However, as is shown in the latter case, the effect of increasing the yield of the product cannot be achieved when the amount of carbon black is increased. Instead, a decrease in a coefficient of thermal conductivity is caused so that a difference in temperature between the middle portion and the circumferential portion of the reactor occurs, leading to a local irregularity in the length and diameter of the product and to heterogeneity in the production state of the whisker product. Furthermore, in the latter case, the amount of carbon black remaining unreacted is increased so that post-treatment (burning treatment) procedures become laborious and complicated.

In instances where the amount of carbon black was below the lower limit, i.e., 80 parts by weight, a large amount of silicon carbide crystals of fine granular form was produced, with a resultant low whisker yield of 65% by weight based on the siliceous source material.

Examples 16–17 and Comparative Example 14

100 parts by weight of a fine powder of a silica gel prepared in the same manner as in Examples 1 to 11 so as to contain 10.0% by weight of cobalt chloride ($CoCl_2.6H_2O$) based on the silicon was homogeneously mixed with 110 parts by weight of an IISAF-Hs grade furnace carbon black ("SEAST 5H": Tokai Carbon Co., Ltd.) as carbonaceous source having a DBP absorption number of 130 ml/100 g and an iodine absorption number of 104 mg/g. The mixture was then reacted by heating in the same manner and using the same apparatus as in Examples 1 to 11 for 4 hours at varying temperatures as shown in Table 4 below. The reaction product was further heated in the same manner as in Examples 1 to 11 to burn off the remaining unreacted carbonaceous source.

The resulting products were found to be composed mainly of silicon carbide single crystals of the $\beta$-form as in the case of the products obtained in Examples 1 to 11. The products obtained herein were measured for their yield, degree of granular silicon carbide contamination and properties. The results are shown in Table 4 below.

tion (Examples 16 and 17) provided favorable yields of silicon carbide whiskers having good properties.

Where the reaction was conducted at temperatures above the upper limit of 1,700° C., i.e., 1,750° C., the resulting silicon carbide whiskers was brittle and so thick and short that it was impractical.

Example 18

Fine powder of a silica gel prepared in the same manner as in Examples 1 to 11 so as to contain 7.0% by weight of cobalt chloride ($CoCl_2.6H_2O$) based on the silicon was homogeneously mixed in an amount of 100 parts by weight with 150 parts by weight of furnace carbon black ("SEAST KH": Tokai Carbon Co., Ltd.) having a DBP absorption number of 119 ml/100 g and an iodine absorption number of 90 mg/g. The mixture was then homogeneously mixed with 100% by weight of sodium chloride based on the silica gel and the resulting homogeneous mixture was reacted by heating at 1,600° C. for 2 hours in the same manner and using the same apparatus as in Examples 1 to 11. The reaction products were further thermally treated in the same manner as in Examples 1 to 11 so as to burn off the remaining unreacted carbonaceous source.

The resulting product was found to be in the form of a sponge, and to be considerably more bulky than the products obtained without the addition of sodium chloride. It was also found that the whiskers was longer by about 100% than those produced without sodium chloride and that its size properties were extremely homogeneous. It was further found that the product of Example 18 was composed of pure silicon carbide single crystals of the $\beta$-form.

Example 19–20

A mixture of 100 parts by weight of fine powder of a silica gel prepared in the same manner as in Examples 1 to 11 so as to contain 7.0% by weight of cobalt chloride ($CoCl_2.6H_2O$) based on the silicon with 110 parts by weight of furnace carbon black ("SEAST 5H": Tokai Carbon Co., Ltd.) having a DBP absorption number of 130 ml/100 g and an iodine absorption number of 104 mg/g was homogeneously mixed with sodium chloride powder in the amounts with respect to the silica gel as illustrated in Table 5 below. The resulting raw material

TABLE 4

| | | Carbon black | | | | | | | Properties | | |
|---|---|---|---|---|---|---|---|---|---|---|---|
| | Trade name | DBP absorption number (ml/100 g) | Iodine absorption number (mg/g) | Amount (parts by wt.) | Catalyst: $CoCl_2$. $6H_2O$ (% by wt. per Si) | Heating temperature and period (°C. - hrs) | Yield (% by wt. per Si source material) | Degree of granular SiC contamination (microscopic observation)* | Diameter ($\mu$m) | Length ($\mu$m) | Homogeneity** |
| Comparative Example 14 | SEAST 5H | 130 | 104 | 110 | 10.0 | 1200 - 4 | Extremely small | | | | Poor |
| Example 16 | SEAST 5H | 130 | 104 | 110 | 10.0 | 1510 - 4 | 97 | ± | 0.1~0.3 | 100~300 | Good |
| Example 17 | SEAST 5H | 130 | 104 | 110 | 10.0 | 1560 - 4 | 98 | — | 0.2~0.5 | 200~300 | Good |

Note
The degree of granular SiC contamination * and the homogeneity rating ** are referred to in notes accompanying Table 1.

The results shown in Table 4 above reveal that Comparative Example 14 in which the reaction was conducted at temperatures below the lower limit of 1,300° C. produced an extremely small amount of silicon carbide whiskers and provided a poor homogeneity thereof. The examples according to the present invention system was then reacted by heating at 1,600° C. for 2 hours in the same manner and using the same apparatus as in Examples 1 to 11. Thereafter, the resulting product was further heated to burn off the remaining unreacted carbonaceous source.

It was found that the whiskers produced according to the present invention (Examples 19 and 20) was composed of pure silicon carbide single crystals of the β-form and that the elongation of the crystal was more recognizable and its homogeneity was more favorable, as in the case of the product obtained in Example 18, as compared to the products obtained without the addition of sodium chloride in accordance with the present invention.

The products obtained herein were observed for their yield, degree of granular silicon carbide contamination and properties in the same manner as in Examples 1 to 11. The results are shown in Table 5 below.

TABLE 5

| | Carbon black | | | | | | | Properties | | |
|---|---|---|---|---|---|---|---|---|---|---|
| | Trade name | DBP absorption number (ml/100 g) | Iodine absorption number (mg/g) | Amount (parts by wt.) | Catalyst: $CoCl_2 \cdot 6H_2O$ (% by wt. per Si) | Amount of NaCl (% by wt. per silica gel) | Yield (% by wt. per Si source material) | Degree of granular SiC comtamination (microscopic observation)* | Diameter (μm) | Length (μm) | Homogeneity** |
| Example 19 | SEAST 5H | 130 | 104 | 110 | 10.0 | 80 | 98 | — | 0.3~0.5 | 150~300 | Good |
| Example 20 | SEAST 5H | 130 | 104 | 110 | 10.0 | 200 | 99 | — | 0.3~0.5 | 200~500 | Good |

Note
The degree of granular SiC contamination * and the homogeneity rating ** are referred to in notes accompanying Table 1.

What is claimed is:

1. A process for preparing silicon carbide whiskers comprising mixing 100 parts by weight of a silica gel, containing 6.0 to 25.0% by weight with respect to a silicon of a water-soluble compound of at least one metal selected from the group consisting of iron, nickel and cobalt, with 110 to 400 parts by weight of a furnace carbon black having a structure indicated by a DBP absorption number of not lower than 50 ml/100 g, and reacting the resultant mixture by heating at a temperature ranging from 1,300° to 1,700° C. in a non-oxidizing atmosphere.

2. A process according to claim 1, wherein 80 to 200% by weight with respect to the silica gel of sodium chloride is further added as a material for forming a space for production of the silicon carbide whiskers.

3. A process according to claim 1, wherein the silica gel to be used is one obtainable by immersing a silica gel fine powder having a particle size of not larger than 150 mesh in an aqueous solution of a chloride or nitrate of at least one metal selected from the group consisting of iron, nickel and cobalt, and drying the silica gel.

4. A process according to claim 2, wherein the silica gel to be used is one obtainable by immersing a silica gel fine powder having a particle size of not larger than 150 mesh in an aqueous solution of a chloride or nitrate of at least one metal selected from the group consisting of iron, nickel and cobalt, and drying the silica gel.

5. A process according to claim 1, wherein the silica gel which is to contain the water-soluble compound therein is silicic acid containing an $SiO_2$ component of 99.5% and having a fine porous structure with a surface area of not less than 450 m²/g.

6. A process according to claim 2, wherein the silica gel which is to contain the water-soluble compound therein is silicic acid containing an $SiO_2$ component of 99.5% and having a fine porous structure with a surface area of not less than 450 m²/g.

7. A process according to claim 1, wherein the silica gel which is to contain the water-soluble compound therein is a synthetic silica gel obtainable by decomposing sodium silicate with an inorganic acid.

8. A process according to claim 2, wherein the silica gel which is to contain the water-soluble compound therein is a synthetic silica gel obtainable by decomposing sodium silicate with an inorganic acid.

9. A process according to claim 1, wherein a remaining unreacted carbonaceous source of a reaction product is removed by heating in air at a temperature of at least 550° C.

10. A process according to claim 2, wherein a remaining unreacted carbonaceous source of a reaction product is removed by heating in air at a temperature of at least 550° C.

* * * * *